United States Patent
Arias Vicente et al.

(10) Patent No.: US 12,484,450 B2
(45) Date of Patent: Nov. 25, 2025

(54) LATTICE STRUCTURE WITH PIEZOELECTRIC BEHAVIOR, A FORCE OR MOVEMENT SENSOR AND AN ACTUATOR CONTAINING SAID LATTICE STRUCTURE

(71) Applicant: Universitat Politecnica De Catalunya, Barcelona (ES)

(72) Inventors: Irene Arias Vicente, Barcelona (ES); Amir Abdollahi, Barcelona (ES); Alice Mocci, Barcelona (ES); David Codony Gisbert, Barcelona (ES)

(73) Assignee: Universitat Politecnica De Catalunya, Barcelona (ES)

( * ) Notice: Subject to any disclaimer, the term of this patent is extended or adjusted under 35 U.S.C. 154(b) by 776 days.

(21) Appl. No.: 17/798,137

(22) PCT Filed: Feb. 11, 2021

(86) PCT No.: PCT/EP2021/053335
§ 371 (c)(1),
(2) Date: Aug. 8, 2022

(87) PCT Pub. No.: WO2021/160738
PCT Pub. Date: Aug. 19, 2021

(65) Prior Publication Data
US 2023/0077109 A1 Mar. 9, 2023

(30) Foreign Application Priority Data
Feb. 12, 2020 (EP) .................................. 20382094

(51) Int. Cl.
*H01L 41/18* (2006.01)
*H10N 30/20* (2023.01)
*H10N 30/87* (2023.01)

(52) U.S. Cl.
CPC ......... *H10N 30/872* (2023.02); *H10N 30/204* (2023.02); *H10N 30/875* (2023.02)

(58) Field of Classification Search
CPC ... H10N 30/872; H10N 30/302; H10N 30/875
(Continued)

(56) References Cited

U.S. PATENT DOCUMENTS

| | | |
|---|---|---|
| 2011/0006641 A1 | 1/2011 | Cross et al. |
| 2011/0094306 A1 | 4/2011 | Bratkovski et al. |

(Continued)

FOREIGN PATENT DOCUMENTS

| | | |
|---|---|---|
| WO | WO2008005820 | 1/2008 |
| WO | WO2019227082 | 11/2019 |

OTHER PUBLICATIONS

European Patent Office; Search Report and Written Opinion for PCT/EP2021/053335; Oct. 29, 2021; entire document.

*Primary Examiner* — Derek J Rosenau
(74) *Attorney, Agent, or Firm* — Allen, Dyer, Doppelt & Gilchrist, P.A.

(57) ABSTRACT

Lattice structure with piezoelectric behavior characterized in that the lattice structure (1) comprises a periodic succession of unitary cells (10), wherein each unitary cell (10) is made of a dielectric material, is bending or torsion dominated and comprises nanometric structural connectors (11) connected to each other through nodes (12) defining a non-centrosymmetric shape having a topological constraint that induces torsion or bending of said structural connectors (11); and wherein the unitary cells (10) are connected to each other at least in series defining a continuous electric potential accumulation path with two opposed ends (2, 3), the unitary cells (10) being arranged within the lattice structure (1) in a non-centrosymmetric disposition accumulating and conducting without cancellation the electric gradient generated (Continued)

on each unitary cell (10) through the lattice structure (1) to said two opposed ends (2, 3).

16 Claims, 6 Drawing Sheets

(58) Field of Classification Search
USPC .......................................................... 310/357
See application file for complete search history.

(56) References Cited

U.S. PATENT DOCUMENTS

2018/0373120 A1* 12/2018 Halasyamani .......... C30B 29/14
2020/0071181 A1*  3/2020 Zur Loye ............... C01G 9/006

* cited by examiner

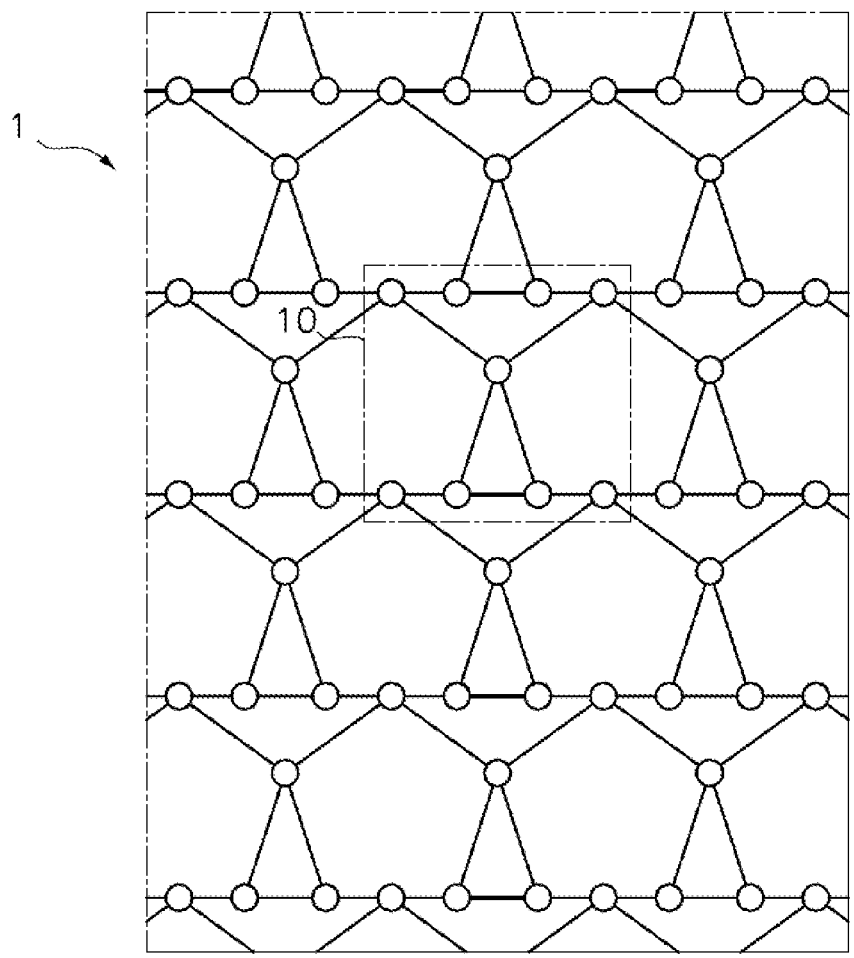
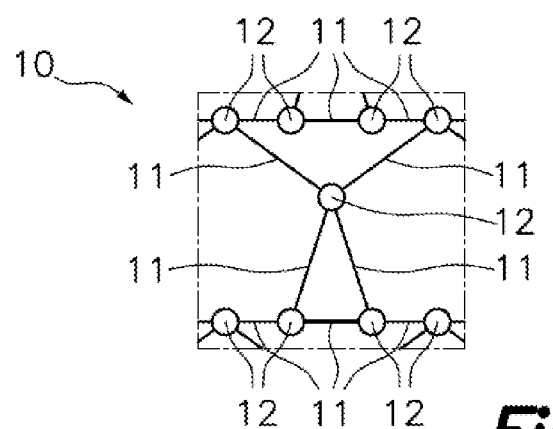
Fig. 1a
Fig. 1b

LATTICE STRUCTURE WITH PIEZOELECTRIC BEHAVIOR, A FORCE OR MOVEMENT SENSOR AND AN ACTUATOR CONTAINING SAID LATTICE STRUCTURE

TECHNICAL FIELD

The present invention is directed, according to a first aspect, to a lattice structure with piezoelectric behavior made of a dielectric and possibly non-piezoelectric material with flexoelectric properties containing structural connectors of nanometric to micrometric thickness.

According to a second aspect, the present invention is directed to a force or movement sensor including said lattice structure to generate a measurable electric potential when affected by a force such as compression, traction, rotation or flexion force.

According to a third aspect, the present invention is directed to an actuator containing said lattice structure to generate a measurable force or movement, for example an axial, flexile or rotational force or movement, when an electric potential is applied to the lattice structure.

STATE OF THE ART

Piezoelectric materials, which generate a measurable electric potential when subjected to a deformation, and conversely, a measurable deformation under an electric stimulus, are well known materials. The most commonly used piezoelectric material is lead zirconate-titanate, but there are environmental and public health concerns related to the production and use of any lead containing material. It has proved difficult to find any better material, using conventional approaches.

Flexoelectric effect of dielectric materials is also a well stablished knowledge but said flexoelectric effect produces extremely small electric potentials with no practical application.

Document WO2008005820 describe a structure made of a first material with flexoelectric properties which generates an electric potential when an external force is applied.

The structures shown on this document have a centrosymmetric shape, preventing the accumulation of the electric potential generated therein.

Also, the structure proposed on this document is in the millimeter scale. In this scale the flexoelectric properties of the dielectric materials generate extremely small electric potentials barely usable.

Document WO2019227082 describe a lattice structure comprising a periodic succession of unitary cells made of struts connected to each other through nodes.

On this document WO2019227082 the material constitutive of the unitary cells is a piezoelectric material or a mixture of functionalized piezoelectric particles embedded in a matrix of non-piezoelectric material. According to this document the functionalized piezoelectric particles constitute at least 10% in weight of the material.

According to some examples described on this document, said unitary cells can have a non-centrosymmetric structure, which will generate some degree of electric gradient under flexion or torsion, but this electric gradient is not measurable or is irrelevant when generated in struts having a thickness above 10 microns, and this document is silent on the size of said struts.

Furthermore, this document does not describe the geometric disposition of the unitary cells within the lattice structure, which is critical to conduct and accumulate the electric gradient generated without cancellation through said unitary cell. The present invention proposes a solution to the above and other problems.

BRIEF DESCRIPTION OF THE INVENTION

According to a first aspect, the present invention is directed to a lattice structure with piezoelectric behavior, said lattice structure comprising a periodic succession of unitary cells.

A lattice structure includes hollow meshes or grids made of structural connectors, such as struts or shells, interconnected through nodes. Said nodes can be punctual nodes when the structural connectors are struts or lineal nodes when the structural connectors are shells.

In this case said lattice structure is defined as a periodic succession of unitary cells including interconnected structural connectors. Multiple unitary cells, preferably but not necessarily identic unitary cells, are repeated in a unidimensional, bidimensional or tridimensional array disposition creating said lattice structure. Therefore, the unitary cell can be defined as the minimal structure made of structural connectors fulfilling the definition of the unitary cell included on this application, which is repeated in the lattice structure.

The piezoelectric materials are materials that generate a measurable electric potential when subjected to a deformation, and conversely, a measurable deformation under an electric stimulus. In the context of this application, it will be understood that the piezoelectric behavior defined above is referred to structures which are made of materials that produce the same effect than the piezoelectric materials, i.e. that produce an electric potential when subjected to deformation, and conversely, a measurable deformation under an electric stimulus. When said structures are made of piezoelectric material, the piezoelectric behavior is assured, but also non-piezoelectric materials can produce the same effect than the piezoelectric materials.

The present invention proposes, in a manner not known in the prior art, a lattice structure made of periodically repeated unitary cells including structural connectors of nanometric to micrometric thickness, defined as a thickness equal or smaller than 10 micrometers, interconnected through nodes, each unitary cell being made of a first material which is a dielectric material with flexoelectric properties.

Said first material will be preferably a non-piezoelectric material, which typically are cheaper and easier to produce than the piezoelectric materials, but said first material will have a disposition intended to obtain a piezoelectric behavior from said non-piezoelectric materials by exploiting the flexoelectric properties of said non-piezoelectric materials.

The dielectric non-piezoelectric material with flexoelectric properties does not have the ability to generate electric potential at the molecular level when subjected to deformation, but they have the ability to generate electric potentials at a nanometric to micrometric scale when a solid made with those materials suffers a non-homogeneous deformation such as bending, torsion or non-homogeneous compression.

Equally, the dielectric non-piezoelectric material with flexoelectric properties does not have the ability to undergo a measurable deformation at the molecular level under a uniform electric stimulus, but they have the ability to produce a measurable deformation at a nanometric to micrometric scale when a solid made with those materials is under a non-uniform electric stimulus at a nanometric to micrometric scale.

The present invention can also be used to enhance the performance of lattice structures made of piezoelectric materials, for example piezoelectric materials with a poor piezoelectric behavior, by exploiting also their flexoelectric properties, in which case the first material can be a dielectric piezoelectric material.

Each unitary cell is bending or torsion dominated and comprises nanometric structural connectors interconnected through nodes defining a non-centrosymmetric shape which topological constraint, When an external force is applied on the lattice structure, it induces torsion or bending of said structural connectors producing an electric gradient on said structural connectors by flexoelectric effect which is accumulated and conducted without cancellation through said unitary cell.

In other words, each unitary cell includes structural connectors made of said first material, said structural connector being organized in such a disposition optimized to produce the bending or torsion of at least some of said structural connectors when a force, for example a compression, traction, flexion or torsion force, is applied to the lattice structure.

It will be understood that the structural connectors are connected to each node in a rigid manner, i.e. in a non-articulated manner.

In the case that structural connectors are struts, at least some of said nodes of each unitary cell will include only four or less nanometric structural connectors connected thereto when integrated in the lattice structure, determining said topological constraint which induces torsion or bending of said structural connectors.

When only two or three structural connectors are connected to a single node, especially when said structural connectors are not coaxial to each other, any force applied induces bending or torsion on said structural connectors. When only four structural connectors are connected to a single node bending or torsion and also stretching is induced on said structural connectors, but when more than four structural connectors are connected to a single node, then only stretching is induced on said structural connectors, then not producing significant electric gradient thereon.

For example, it is known that a flat triangulated structure in which six structural connectors are connected on each node, or a tridimensional triangulated structure in which even more structural connectors are connected on each node produces only compression and traction strains on said structural connectors when said triangulated structure receives any type of external force, because said triangulated structure decompose the received external force into compression and traction forces. Therefore, the use of only said triangulated structure shall be avoided in the unitary cells of the proposed lattice structure, because it does not induce flexion or torsion on the structural connectors. Despite the above, each unitary cell can contain a combination of nodes including more than four structural connectors connected thereto and nodes including four or less structural connectors connected thereto.

In the present invention other structural connector structures different from the triangulated structures shall be included on the unitary cells, for example structures where four or more structural connectors are connected by their ends in an annular succession surrounding a hollow space defining a non-triangulated polygon or polyhedron which will induce flexion or torsion of the structural connectors when the lattice structure is submitted to an external force.

In order to prevent the generation of symmetric electric potentials within each unitary cell which will produce the mutually cancellation the structural connectors contained on each unitary cell shall have a non-centrosymmetric disposition. This shape assures that there do not exist two symmetric structural connectors that undergo a symmetric deformation, and therefore producing the same electric potential of opposite sign causing mutual cancellation, under certain external force.

A centrosymmetric object is an object that has a symmetry center, so that each point of that object has another point symmetric in regard to said symmetry center. A non-centrosymmetric object is an object lacking said symmetry center. Some non-centrosymmetric objects can be symmetric in regard to a symmetry line or a symmetry plane.

A chiral object is an object distinguishable from its mirror image, that is, it cannot be superposed onto it. Conversely, a mirror image of a non-chiral object, such as a sphere, cannot be distinguished from the object. All chiral objects are necessarily non-centrosymmetric. In the present invention the unitary cells are preferably chiral objects.

In the proposed invention the unitary cells are connected to each other at least in series and optionally also in parallel defining, within the lattice structure, a continuous electric potential accumulation path defined between two opposed ends of said lattice structure provided with electric connections and the unitary cells are arranged within the lattice structure in a non-centrosymmetric disposition configured to accumulate and conduct without cancellation the electric gradient generated on each unitary cell through the lattice structure to said two opposed ends.

In other words, each unitary cell has a non-centrosymmetric shape and said unitary cells are periodically repeated within the lattice structure, producing a non-centrosymmetric lattice, to prevent the mutual cancellation of the electric potentials generated on two interconnected unitary cells.

The resulting lattice structure conducts and accumulates the electric potentials generated on all the interconnected unitary cells resulting in an electric potential measurable on the two opposed ends of the continuous electric potential accumulation path when the lattice structure is subjected to strain.

According to one embodiment, each unitary cell includes at least one node with only four or less nanometric to micrometric structural connectors connected thereto when integrated in the lattice structure, determining said topological constraint which induces torsion or bending of said structural connectors. Any structure made of structural connectors and nodes where some nodes connect four or less structural connectors determine, according to the rigidity theory, a bending or twisting dominated structure in which an external force applied to the lattice structure generates bending or twisting forces on said structural connectors.

Additionally, or alternatively, even if the unitary cell and lattice are stretching dominated according to the rigidity theory, when sufficiently deformed some compressed structural connectors can buckle, and hence bend or twist and generate flexoelectric potential. If the lattice is specially designed so that the buckling pattern is non-centrosymmetric, said lattice will result in the constructive accumulation of electric potential.

So, if at least some of the struts connected to one node are buckling dominated, the topological constraint of the unitary cell containing said node will induce torsion or bending of said struts under an external force applied on the lattice structure. So that when an external force is applied on the lattice structure, said struts suffer buckling, producing local bending of parts of the struts which generate an electric gradient.

Preferably said unitary cells are bending or torsion dominated under an external force applied on the lattice structure comprised within a working force range, an upper limit of said working force range being lower than a breaking limit of a weakest point of the lattice structure.

According to an optional embodiment of the present invention the periodic succession of unitary cells is a unidirectional periodic succession of unitary cells defining a linear, circular or helicoidal lattice structure, i.e. a linear chain of unitary cells in succession resulting with a straight shape, a circular shape or a helicoidal shape.

In an alternative embodiment the periodic succession of unitary cells is a bidirectional periodic succession of unitary cells defining a laminar lattice structure, i.e. a planar matrix of unitary cells.

The periodic succession of unitary cells can also be a tridirectional periodic succession of unitary cells defining a tridimensional lattice structure, i.e. a tridimensional mesh.

According to another embodiment, each unitary cell further comprises a non-bar shaped indeformable solid element made of said first material and including multiple nodes embedded therein where bending or torsion dominant structural connectors of the unitary cell are connected. For example, said non-bar shaped indeformable solid element can be a cube-shaped indeformable solid element including eight nodes, each embedded on one vertex of said cube-shaped indeformable solid element, and the structural connectors of the unitary cell will be connected to said nodes.

Said indeformable solid element transfers forces from one node integrated therein to another node integrated therein, and because said nodes are separated to each other, said transference can induce bending or torsion on the structural connectors connected thereto, especially when said nodes integrated in the indeformable solid element are at least three not coaxial nodes, and/or when at least two structural connectors connected to said indeformable solid element are not coaxial to each other.

According to an additional embodiment of the present invention, the lattice structure further comprises second connectors interposed between adjacent unitary cells, said second connectors being made of a second material which is a non-piezoelectric material with a lower dielectric constant than the first material, said second material transferring strains between adjacent unitary cells but without integrating said continuous electric potential accumulation path, i.e. without sustaining a significant electric field. Said second connectors can be connected to some of said structural connectors, inducing its bending or torsion when an external force is applied, but not conducting the electric gradient generated on said structural connectors therethrough.

Only the parts made of the first material shall have a non-centrosymmetric shape to achieve the aimed effect. If the combination of first and second materials has a centrosymmetric shape, this does not prevent the generation and conduction of electric gradients through the continuous electric potential accumulation path defined on the lattice structure if the parts made only of the first material have a non-centrosymmetric shape and are connected to each other in a non-centrosymmetric disposition within the lattice structure.

The non-centrosymmetry of each unitary cell is achieved by the non-centrosymmetric disposition of the components made of the first material constitutive of said unitary cell. Said unitary cells, which components are made of first material, are disposed within the lattice structure also in a non-centrosymmetric disposition generating the continuous electric potential accumulation path. The lattice structure can further include said second connectors, made of the second material, connecting some of the unitary cells to each other for transferring loads, in some cases resulting in a centrosymmetric lattice structure comprising non-centrosymmetric parts made of the first material with inclusions of the second material. So, those parts of the lattice structure made of the first material have a non-centrosymmetric shape, even if the combination of first and second materials have, as a whole, a centrosymmetric shape.

Said second material has lower dielectric properties than the first material, which breaks the overall centrosymmetry of the overall system in an otherwise geometrically centrosymmetric lattice, i.e. if two points of the lattice structure are symmetric in regard to a center, constituting a lattice with a centrosymmetric geometry, but those points have a different properties (for example different dielectric constant) then the resulting lattice is not a centrosymmetric lattice despite having a centrosymmetric geometry. For example, a succession of unitary cells can be continuously connected to each other between two opposed ends including electric connectors, and the lattice structure further comprises second connectors arranged between adjacent unitary cells of the lattice structure to define a continuous electric potential accumulation path between said opposed ends with electric connectors with a zigzagging shape within the lattice structure.

According to another embodiment, the lattice structure can be an helicoidal lattice structure wherein each unitary cell is connected at least to a single second connector in the shape of central column surrounded by said helicoidal lattice structure wherein the unitary cells are repeated through a combination of translations and rotations, leading to said helical lattice.

According to a second aspect, the present invention is directed to a movement sensor. Said proposed movement sensor comprises a lattice structure as described above in the first aspect, said lattice structure being structurally connected to two independent elements liable to be moved independently to each other, and said lattice structure having the two opposed ends connected to an electric circuit containing an electric potential sensor. When a movement between said two independent elements is produced, they transmit an external force to the lattice structure connected thereto. The bending or torsion dominated structural connectors of said lattice structure suffer a deformation which generates an electric gradient, which is conducted without cancellation, reaching said two opposed ends thereof, where said electric gradient is conducted to an electric potential sensor which can measure said electric gradient indicative of the external force applied on the lattice structure and therefore indicative of the movement produced between said two independent elements.

The independent elements can be attached to opposed sides of the lattice structure, and the relative movement between said two independent elements can induce torsion, twisting, shear, traction or compression to the lattice structure.

According to a third aspect, the present invention is directed to an actuator comprising a lattice structure as described above in the first aspect, said lattice structure being structurally connected to two independent elements liable to be moved independently, and said lattice structure having the two opposed ends connected to an electric circuit containing an electric potential source.

When an electric current is applied on the two opposed ends of the lattice structure from the electric potential source, a bending or torsion is generated on the structural connectors of the unitary cells which are bending or torsion dominated, the accumulation of the movement of said structural connectors of all the unitary cells of the lattice structure producing an appreciable movement of the lattice structure between said two opposed ends thereof.

Other features of the invention appear from the following detailed description of an embodiment.

BRIEF DESCRIPTION OF THE FIGURES

The foregoing and other advantages and features will be more fully understood from the following detailed description of an embodiment with reference to the accompanying drawings, to be taken in an illustrative and non-limitative manner, in which:

FIG. 1a shows a portion of a flat laminar lattice structure including multiple unitary cells shown in detail on FIG. 1b, connected to each other in series and also in parallel;

DETAILED DESCRIPTION OF AN EMBODIMENT

Figure 2A:
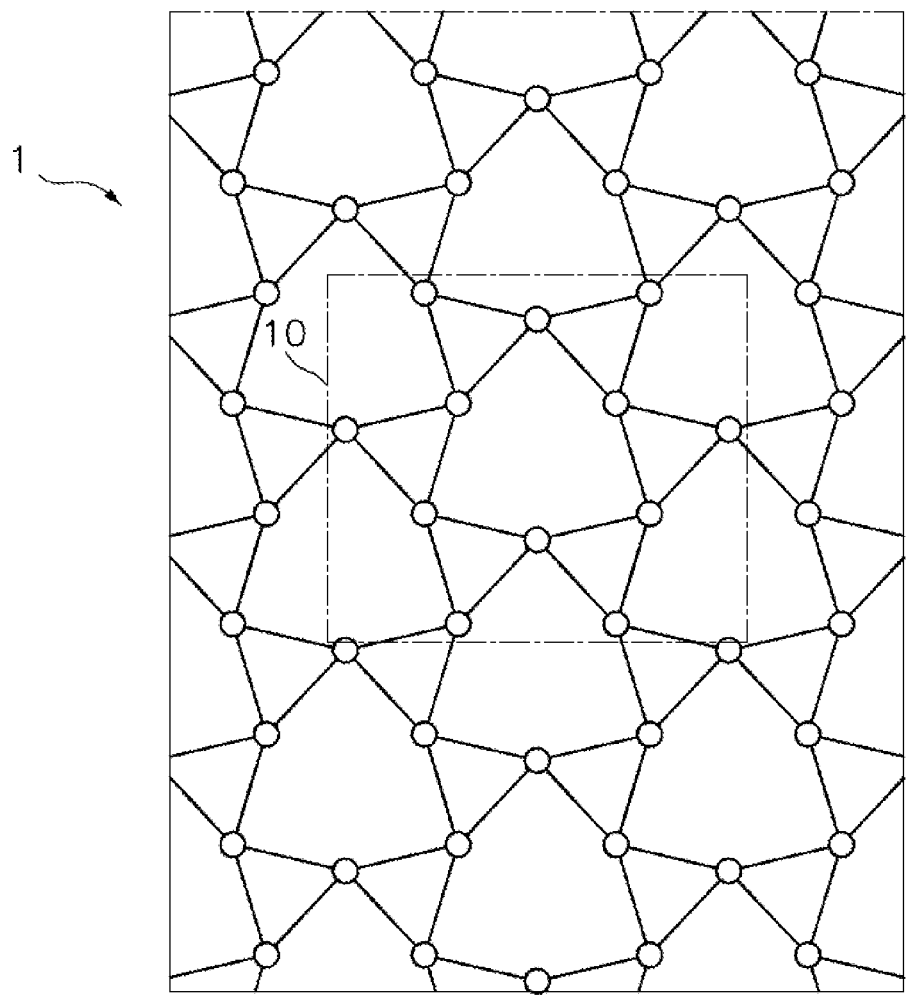
FIG. 2a shows a portion of a flat laminar lattice structure including multiple unitary cells shown in detail on FIG. 2b, connected to each other in series and also in parallel.

The foregoing and other advantages and features will be more fully understood from the following detailed description of an embodiment with reference to the accompanying drawings, to be taken in an illustrative and not limitative.

The present invention comprises multiple unitary cells 10 arranged in a periodic succession and connected to each other generating a lattice structure 1 with two opposed ends 2 and 3 including electric connectors, determining a continuous electric potential accumulation path therethrough between said two opposed ends 2, 3 thereof.

Each unitary cell 10 comprises multiple structural connectors 11 with correspondent opposed ends connected to correspondent ends of other structural connectors 11 in a rigid manner through nodes 12.

The structural connectors 11 and the nodes 12 are made of a dielectric non-piezoelectric material with flexoelectric properties.

The piezoelectric materials are materials that generate a measurable electric potential when suffer a deformation, typically a uniform deformation, and conversely a measurable deformation under an electric stimulus.

The unitary cells 10 are shaped with a topological constraint that induces torsion or bending on the structural connectors 11 when an external force is applied in said unitary cell 10 through the lattice structure 1, it is to say that the configuration of the connections between the structural connectors 11 on each unitary cell 10 is optimized to ensure that the forces applied on the unitary cells, when decomposed through the structural connectors 11, generate not only compression and traction forces but also bending and torsion forces on at least some of said structural connectors 11, ensuring the generation of an electric gradient by flexoelectric effect on the structural connectors 11 suffering bending or torsion deformation and ensuring the generation of a bending or torsion deformation by flexoelectric effect on said structural connectors 11 when an electric gradient is applied thereto.

To obtain said topological constraint, each node shall include at least one node 12 where only four or less structural connectors 11 are connected. According to the rigidity theory nodes 12 connecting four or less structural connectors 11 are bending or torsion dominated.

Additionally, or alternatively, each node 12 can include at least one node 12 with five or more structural connectors 11 connected thereto which, according to the rigidity theory are stretching dominated, being at least one of said structural connectors 11 buckling dominated. When a structural connector 11 suffer buckling it bends and generates an electric gradient by flexoelectric effect, therefore a buckling dominated structural connector 11 is considered to be also bending or torsion dominated.

A structural connector 11 will be buckling dominated when it has a slenderness factor adjusted to produce the buckling of the structural connector 11 in a rank of forces comprised within a working force range which upper limit is lower than a breaking limit of the weakest point of the lattice structure 1. In other words, said structural connector 11 buckling dominated has a slenderness factor adjusted to induce the buckling of the structural connector 11 when a force is applied on the lattice structure 1 which does not produce the breakage of any part of the lattice structure 1.

To prevent the mutual cancellation of the electric gradient generated on different structural connectors 11 of the unitary cell 10, said unitary cell 10 has a non-centrosymmetric shape. In that manner, the electric gradients generated on all the structural connectors 11 of the unitary cell 10 are conducted through the unitary cell producing its aggregation. Examples of said unitary cells 10 are shown on FIGS. 1b, 2b and 3b.

Figure 2B:
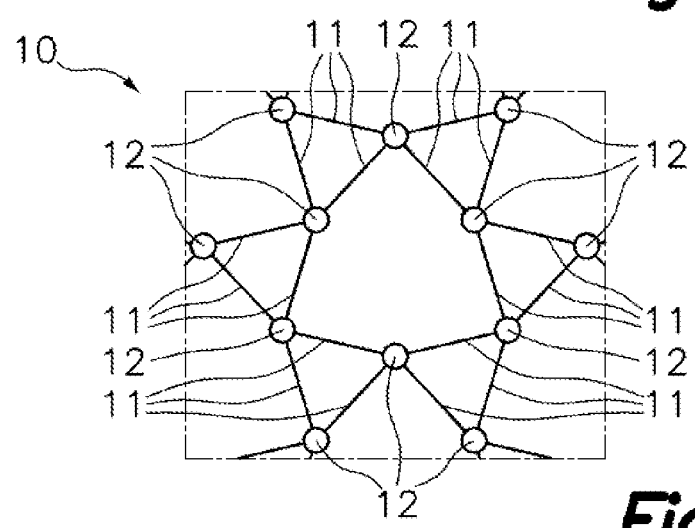
Figure 3A:
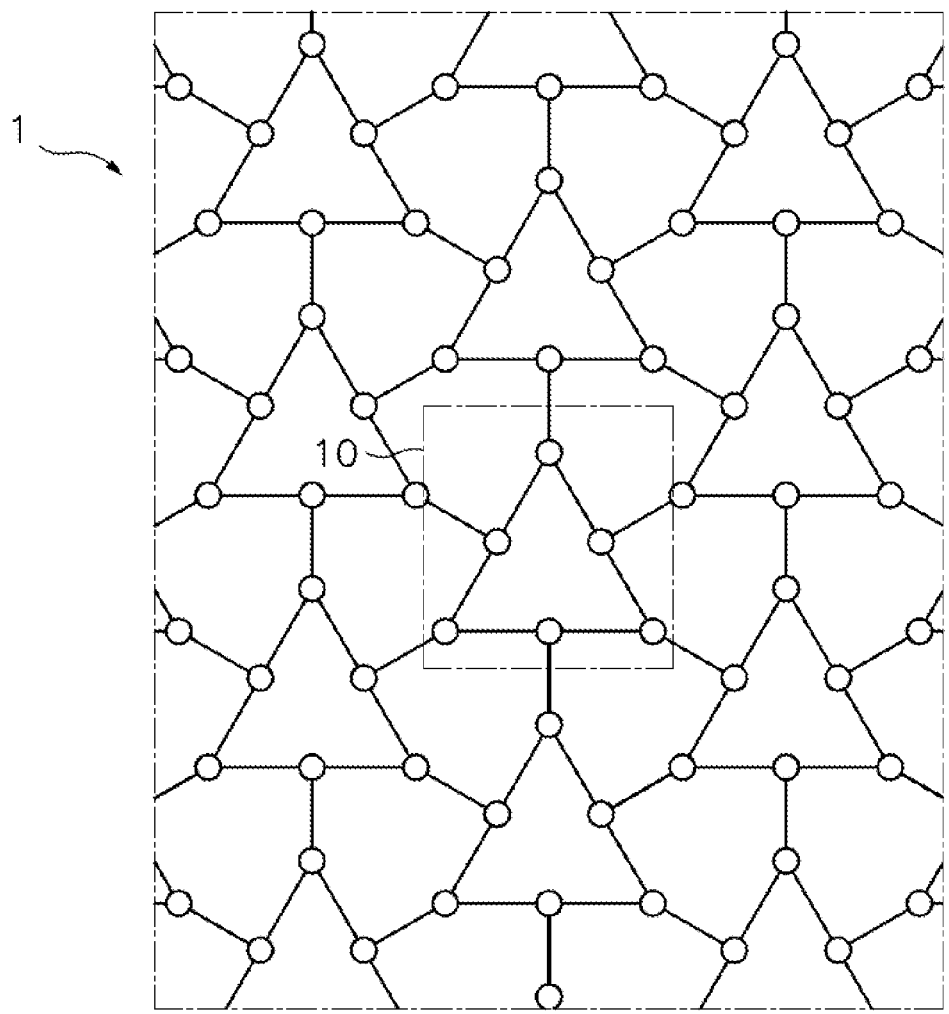
FIG. 3a shows a portion of a flat laminar lattice structure including multiple unitary cells shown in detail on FIG. 3b, connected to each other in series and also in parallel.
Figure 3B:
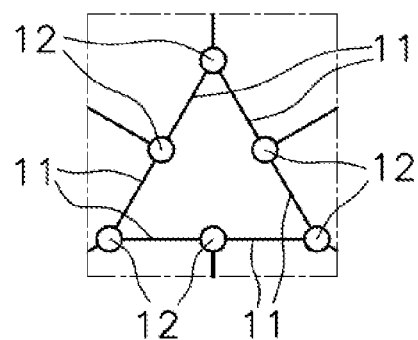

In the embodiment shown on FIG. 3b all the nodes 12 of the unitary cell 11 comprise three structural connectors 11 connected thereto, in the embodiment shown on FIG. 2b all the nodes 12 of the unitary cell 11 comprise four structural connectors 11 connected thereto, and in the embodiment shown on FIG. 1b, the unitary cell 11 comprises some nodes 12 where only three structural connectors 11 are connected and some nodes 12 where four structural connectors 11 are connected.

Said unitary cells 10 are repeated and connected to each other to transmit strains and also electric gradients to the unitary cells 10 and from the unitary cells 10.

Said unitary cells 10 are connected to each other in periodic succession at least in series, generating the lattice structure 1, to sum all the individual electric gradients produced as an output of each unitary cell 10 by the combination of all the electric gradients generated by the structural connectors 11 contained therein. All those electric gradients are accumulated (or added up) through the lattice structure 1 between two opposed ends 2 and 3, defining a continuous potential accumulation path in between. Optionally the unitary cells 10 can be connected in periodic succession not only in series but also in parallel.

In order to prevent the mutual cancellation of the electric gradients produced on different unitary cells 10 of the lattice structure 1 said unitary cells are repeated within the lattice structure 1 in a manner configured to produce a non-centrosymmetric disposition.

The periodic succession of unitary cells can be a unidirectional periodic succession, determining a lineal lattice structure 1 including unitary cells connected in series, a bidirectional periodic succession determining a laminar lattice structure 1 of unitary cells connected in series and also in parallel or a tridirectional periodic succession determining a tridimensional lattice structure 1 of unitary cells connected in series and also in parallel. The 2D lattice structure 1 can also be extruded in the $3^{rd}$ dimensions, then the structural connectors become sheets or shells, It is also proposed the inclusion, within the lattice structure 1, of second connectors 20 made of a second material which is a non-piezoelectric material with a lower dielectric constant than the first material constitutive of the unitary cells 10. Said second connectors 20 are interposed and structurally connected to unitary cells 10 integrated in the lattice structure 1, transmitting strains between said unitary cells 10 connected through the second connector 20.

Because said second connectors 20 are made of the second material which has a lower dielectric constant than the first material, the electric gradient conducted through the lattice structure 1 passes through the first material, which opposes lower resistance to said electric gradient, being the continuous electric potential accumulation path defined only by the parts of the lattice structure 1 made of the first material.

The second connectors 20 generate no appreciable electric gradient and therefore cannot produce the cancellation of the electric gradient generated on the unitary cells 10. Therefore, the second connectors 20 are ignored and not considered when considering the non-centrosymmetric disposition of the unitary cells 10 described above required to avoid the mutual cancellation of the electric gradients.

The disposition of said second connectors 20 within the lattice structure 1 does not interrupt the continuous electric potential accumulation path between the two opposed ends 2 and 3 of the continuous electric potential accumulation path but can modify its potential accumulation path to increase its longitude.

Figure 4:
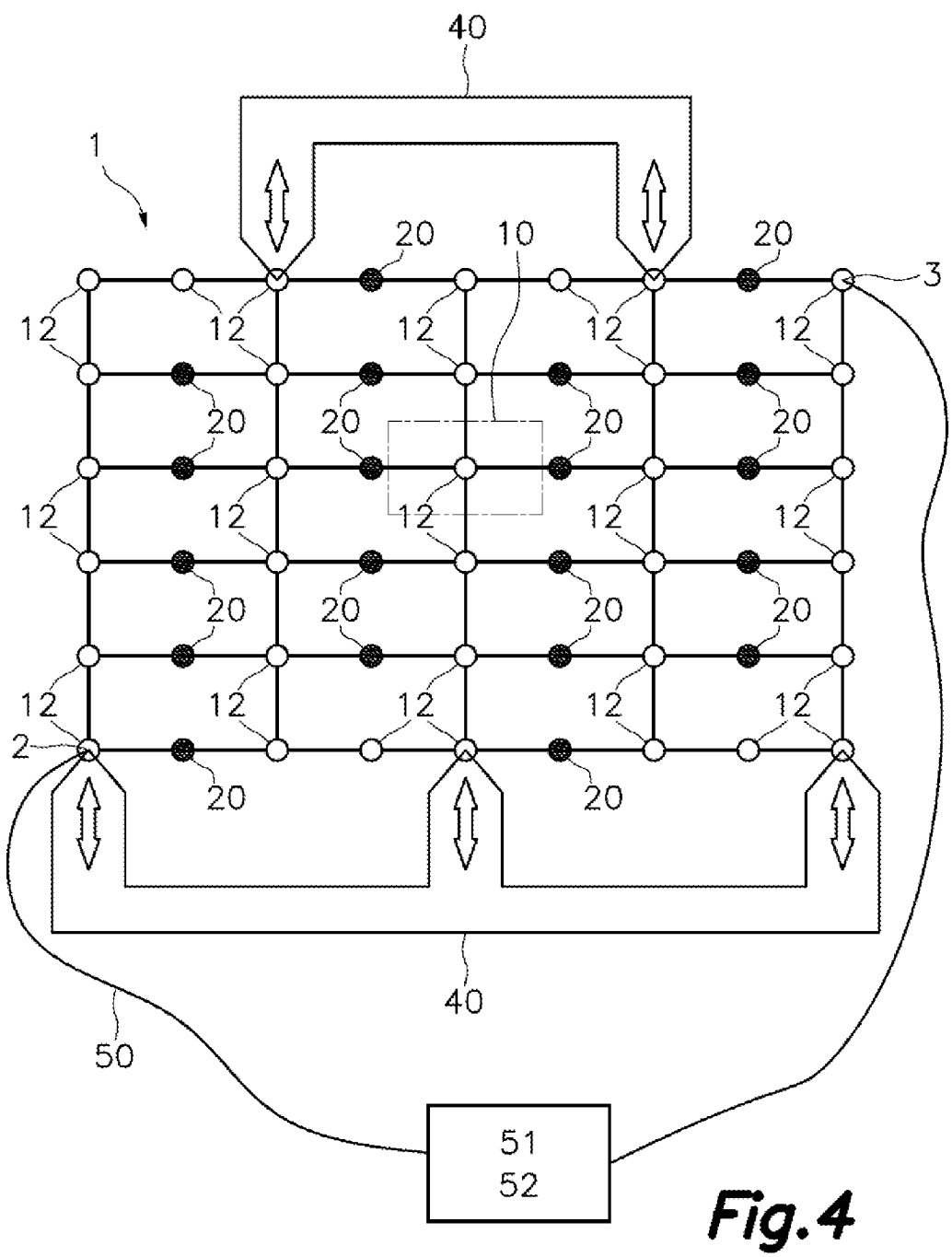
FIG. 4 shows a flat laminar lattice structure including multiple unitary cells connected to each other in series defining an elongated succession of unitary cells which determines a continuous electric potential accumulation path, multiple portions of said elongated succession of unitary cells being laterally connected to other portions of the same elongated succession of unitary cells through second connectors shown as solid black dots in this figure, said elongated succession of unitary cells having a zigzagging shape.

For example, FIG. 4 shows a lattice structure 1 including some unitary cells 10 comprising nodes 12 with two structural connectors 11 connected thereto on the four corners of the lattice structure 1, some unitary cells 10 comprising nodes 12 with three structural connectors 11 connected thereto on the four edges of the lattice structure 1, and some unitary cells 10 comprising nodes 12 with four structural connectors 11 connected thereto in the central regions of the lattice structure 1. In this case some of the unitary cells 10 are connected to adjacent unitary cells through second connectors 20 shown as solid black dots in this figure. Those second connectors 20 are distributed within the lattice structure 1 to modify the continuous electric potential accumulation path defining a zigzagging, or serpentine, continuous electric potential accumulation path within the lattice structure 1 between the two opposed ends 2 and 3 thereof.

This embodiment also includes two independent elements 40 movable relative to each other in an independent manner, that in this example are connected on non-opposed discrete points of opposed sides of the lattice structure 1. The non-opposed discrete points are points connected through the lattice structure by a non-straight line of structural connectors 11. This example also shows an electric circuit 50 connected to two opposed ends 2 and 3 of the lattice structure 1, said electric circuit 50 including an electric potential sensor 51 or an electric potential source 52.

When said two independent elements 40 are moved to each other produce a deformation of the lattice structure 1, producing the combination of the unitary cells 10. Because of the topological constraint of said unitary cells 10 this deformation generates bending or torsion on the structural connectors 11, producing an electric gradient which is conducted and accumulated without cancellation along the continuous electric potential accumulation path. This electric gradient is conducted through the electric circuit to the electric potential sensor 51 which detects the presence of the electric gradient indicative of the existence of the relative movement between the two independent elements 40, allowing the detection of said movement. The intensity of the electric gradient is also indicative of the magnitude of said relative displacement between the two independent elements 40.

In an inverse manner, when the electric potential source 52 is used to inject an electric gradient in the lattice structure 1 through the electric circuit 50, a deformation of the structural connectors 11 is produced, and the accumulation of the deformation of all the deformed structural connectors 11 produces a measurable displacement of the lattice structure 1 and of the independent elements 40 connected thereto.

Figure 5:
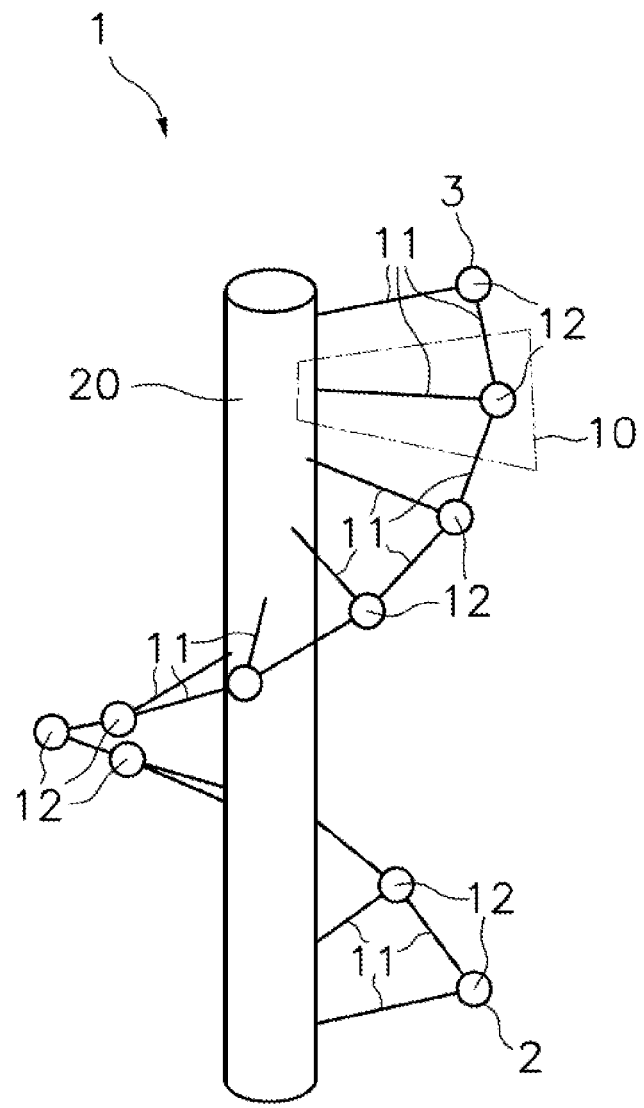
FIG. 5 shows a helicoidal lattice structure including a unidirectional periodic succession of unitary cells surrounding and connected to a second connector in the shape of a central column.

An additional example of lattice structure 1 including second connectors 20 is shown on FIG. 5, which represents a lineal lattice structure 1 where the unitary cells 10 comprises a single node 12 with three structural connectors 11 connected thereto. Said unitary cells 10 have two structural connectors 11 connected to the adjacent unitary ell 10, and one structural connector 11 connected to a second connector 20 in the shape of a central column, generating a helicoidal shape surrounding said central column. In this embodiment a torsion applied on one end 2 of the lattice structure 1 in regard to the opposed end 3 around the central column produces the same effect described in regard to the FIG. 4, permitting the detection of a rotational movement or the generation of a rotational movement.

Figure 6:
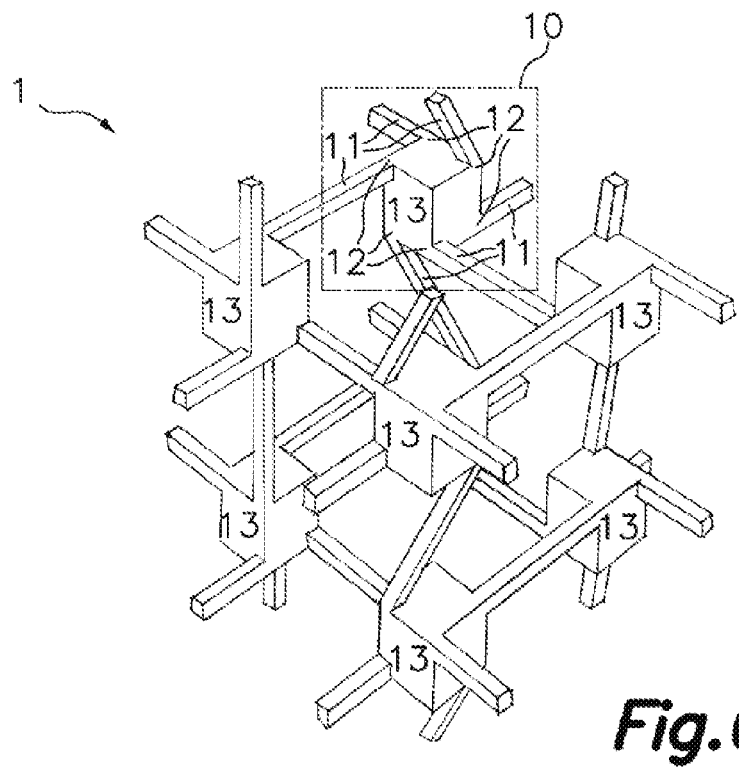
FIGS. 6 and 7 shows a portion of a tridimensional lattice structure including multiple unitary cells.
Figure 7:
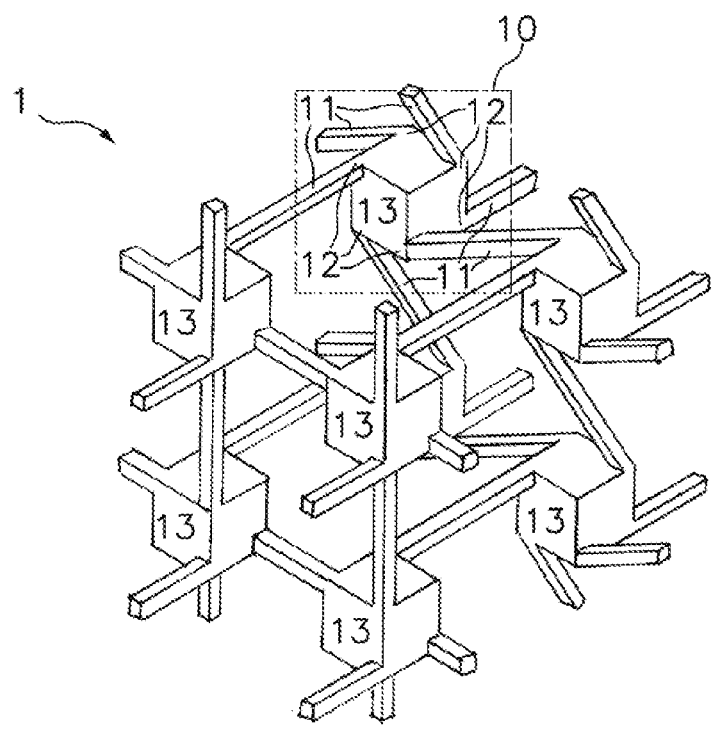

FIGS. 1a, 2a and 3a show examples of laminar lattice structures 1, and FIGS. 6 and 7 shown examples of tridimensional lattice structures 1.

In the tridimensional lattice structures 1 shown in the attached figures, indeformable solid elements 13 are included within the unitary cells 10. Each indeformable solid element 13 integrates several nodes 12 with structural connectors 11 connected thereto. Because the nodes 12 integrated in a single indeformable solid element 13 are not in the same point in the space, the distance between them generates bending forces when a strain is transmitted between structural connectors 11 connected to different nodes 12 of the same indeformable solid element 13, especially when said structural connectors 11 are not coaxial to each other. Therefore, those indeformable solid elements 13 also determine a topological constraint that induces bending or torsion on the structural connectors 11 connected thereto.

In those examples the indeformable solid elements 13 are cubes, each including six nodes 12, one on each vertex of the cube, and each node 12 being connected only to one or two structural connectors 11.

It will be understood that various parts of one embodiment of the invention can be freely combined with parts described in other embodiments, even being said combination not explicitly described, provided there is no harm in such combination.

What is claimed is:

1. A lattice structure comprising piezoelectric properties and a periodic succession of unitary cells, wherein:
   each unitary cell is made of a first material, which is a dielectric non-piezoelectric material comprising flexoelectric properties and is configured to be bending or torsion dominated, each unitary cell comprising structural connectors of nanometric to micrometric thickness, the structural connectors being connected to each other through nodes defining a non-centrosymmetric shape comprising a topological constraint that is configured to induces torsion or bending of the structural connectors and to produce an electric gradient on the structural connectors by a flexoelectric effect that is accumulated and conducted without cancellation through the unitary cell;
   the unitary cells being connected to each other at least in series and configured to define, within the lattice structure a continuous electric potential accumulation path defined between two opposite ends of the lattice structure provided with electric connections; and
   the unitary cells being arranged within the lattice structure in a non-centrosymmetric disposition and configured to accumulat and conduct without cancellation the electric gradient generated on each unitary cell through the lattice structure to the two opposited ends.

2. The lattice structure according to claim 1, wherein each unitary cell includes at least one node with only four or less nanometric structural connectors connected thereto when integrated in the lattice structure, the only for or less nanometric structural connectors collectively structured to determine the topological constraint which is configured to induces torsion or bending of the structural connectors under an external force applied on the lattice structure.

3. The lattice structure according to claim 1, wherein each unitary cell comprises at least one node with five or more nanometric structural connectors connected thereto when integrated in the lattice structure, at least some of the five or more structural connectors being connected to the node, being buckling dominated and configured to determine the topological constraint that induces torsion or bending of the structural connectors under an external force applied on the lattice structure.

4. The lattice structure according to claim 2, wherein the unitary cells are configured to be bending or torsion dominated under an external force applied on the lattice structure comprised within a working force range, an upper limit of the working force range being lower than a breaking limit of a weakest point of the lattice structure.

5. The lattice structure according to claim 1, wherein the periodic succession of unitary cells comprises a unidirectional periodic succession of unitary cells defining a linear, circular or helicoidal lattice structure.

6. The lattice structure according to claim 1, wherein the periodic succession of unitary cells comprises a bidirectional periodic succession of unitary cells defining a laminar lattice structure.

7. The lattice structure according to claim 1, wherein the periodic succession of unitary cells comprises a tridirectional periodic succession of unitary cells defining a tridimensional lattice structure.

8. The lattice structure according to claim 1, wherein each unitary cell further comprises a non-bar shaped indeformable solid element made of the first material and including multiple nodes embedded therein where bending or torsion dominated structural connectors of the unitary cell are connected.

9. The lattice structure according to claim 8, wherein at least two structural connectors connected to the non-bar shaped indeformable solid element are not coaxial to each other.

10. The lattice structure according to claim 1, wherein the lattice structure further comprises a plurality of second connectors interposed between adjacent unitary cells, each one of the plurality of second connectors comprising a second non-piezoelectric material comprising a dielectric constant lower than a dielectric constant of the first material, the second non-piezoelectric material transferring strains between adjacent unitary cells but without integrating the continuous electric potential accumulation path.

11. The lattice structure according to claim 10, wherein each one of the plurality of the second connectors are arranged between adjacent unitary cells to define a continuous electric potential accumulation path with a zigzagging shape within the lattice structure.

12. The lattice structure according to claim 10, wherein the lattice structure is an helicoidal lattice structure, each unitary cell being connected to at least to a single one of the plurality of second connectors and comprising a shape of a central column surrounded by the helicoidal lattice structure.

13. The lattice structure according to claim 1, wherein the structural connectors comprise a thickness equal or smaller than 10 micrometers.

14. The lattice structure according to claim 3, wherein the unitary cells are configured to be bending or torsion dominated under an external force applied on the lattice structure comprised within a working force range, an upper limit of the working force range being lower than a breaking limit of a weakest point of the lattice structure.

15. A movement sensor, comprising a lattice structure comprising a periodic succession of unitary cells wherein:
   each unitary cell is made of a first material, which is a dielectric non-piezoelectric material comprising flexoelectric properties and is configured to be bending or torsion dominated, each unitary cell comprising structural connectors, of nanometric to micrometric thickness, the structural connectors being connected to each other through nodes defining a non-centrosymmetric shape comprising a topological constraint that is configured to induce torsion or bending of the structural connectors and to produce an electric gradient on the structural connectors by a flexoelectric effect that is accumulated and conducted without cancellation through the unitary cell, the unitary cells being connected to each other at least in series and defining, within the lattice structure, a continuous electric potential accumulation path defined between two opposite ends of the lattice structure provided with electric connections, and
   the unitary cells being arranged within the lattice structure in a non-centrosymmetric disposition and configured to accumulate and conduct without cancellation the electric gradient generated on each unitary cell through the lattice structure to the two opposite ends, the lattice structure being structurally connected to two independent elements and disposed in independent movable relation to one another, and the lattice structure having the two opposite ends connected to an electric circuit comprising an electric potential sensor.

16. An actuator comprising a lattice structure comprising a periodic succession of unitary cells wherein:

each unitary cell is made of a first material, which is a dielectric non-piezoelectric material comprising flexoelectric properties and is configured to be bending or torsion dominated, each unitary cell comprising structural connectors of nanometric to micrometric thickness, the structural connectors being connected to each other through nodes defining a non-centrosymmetric shape comprising a topological constraint that is configured to induce torsion or bending of the structural connectors and to produce an electric gradient on the structural connectors by a flexoelectric effect that is accumulated and conducted without cancellation through the unitary cell, the unitary cells being connected to each other at least in series and configured to define, within the lattice structure, a continuous electric potential accumulation path defined between two opposite ends of the lattice structure provided with electric connections, and the unitary cells being arranged within the lattice structure in a non-centrosymmetric disposition and configured to accumulate and conduct without cancellation the electric gradient generated on each unitary cell through the lattice structure to the two opposite ends, the lattice structure being structurally connected to two independent elements and disposed in independent movable relation to one another, and the lattice structure having the two opposite ends connected to an electric circuit comprising an electric source.

* * * * *